United States Patent
Nocito et al.

(10) Patent No.: US 9,133,662 B2
(45) Date of Patent: Sep. 15, 2015

(54) AWNING TYPE SOLAR PROTECTION DEVICE EQUIPPED WITH AN ELECTRICAL POWER PRODUCTION SYSTEM

(75) Inventors: Christophe Nocito, Roubaix (FR); Laurent Raymond, Fournes-en-Weppes (FR); Francois Boussu, Caestre (FR)

(73) Assignee: DICKSON CONSTANT, Wasquehal (FR)

( * ) Notice: Subject to any disclaimer, the term of this patent is extended or adjusted under 35 U.S.C. 154(b) by 607 days.

(21) Appl. No.: 13/247,335

(22) Filed: Sep. 28, 2011

(65) Prior Publication Data
US 2012/0073624 A1    Mar. 29, 2012

(30) Foreign Application Priority Data

Sep. 28, 2010 (FR) ..................... 10 57805

(51) Int. Cl.
*H02S 30/20* (2014.01)
*E06B 9/42* (2006.01)
*E04F 10/06* (2006.01)
*H01L 31/02* (2006.01)
*E06B 9/44* (2006.01)
*E06B 9/24* (2006.01)

(52) U.S. Cl.
CPC ............... *E06B 9/42* (2013.01); *E04F 10/0633* (2013.01); *E04F 10/0666* (2013.01); *E04F 10/0685* (2013.01); *H01L 31/02008* (2013.01); *H02S 30/20* (2014.12); *E06B 9/44* (2013.01); *E06B 2009/2476* (2013.01); *Y02B 10/10* (2013.01); *Y02E 10/50* (2013.01)

(58) Field of Classification Search
CPC ............... E04F 10/0633; E04F 10/0666; E04F 10/0685
See application file for complete search history.

(56) References Cited

U.S. PATENT DOCUMENTS

| 4,250,398 | A  | * | 2/1981 | Ellis et al. ..................... | 219/549 |
| 4,636,579 | A  | * | 1/1987 | Hanak et al. .................. | 136/245 |
| 8,748,729 | B2 | * | 6/2014 | Nocito et al. .................. | 136/245 |
| 2004/0045683 | A1 | * | 3/2004 | Carrillo et al. ................ | 160/310 |
| 2004/0055633 | A1 | * | 3/2004 | Lambey ......................... | 136/244 |
| 2005/0072532 | A1 | * | 4/2005 | Holden et al. .................. | 160/66 |
| 2010/0051100 | A1 | * | 3/2010 | Nocito et al. .................. | 136/256 |
| 2012/0060919 | A1 | * | 3/2012 | Mills et al. ..................... | 136/259 |

FOREIGN PATENT DOCUMENTS

DE    20 2009 005 191 U1    1/2010

OTHER PUBLICATIONS

French Search Report Mar. 15, 2011 of FR 1057805.

* cited by examiner

*Primary Examiner* — Jayne Mershon
(74) *Attorney, Agent, or Firm* — Kenyon & Kenyon LLP (57) ABSTRACT

The invention relates to an awning type solar protection device equipped with an electrical power production system, the device including a flexible panel, at least one photovoltaic panel arranged on the outer face of the flexible panel, a furling tube onto which the flexible panel is rolled and a system for tensioning the flexible panel during its deployment or its furling. According to the invention, the proximal edge of the flexible panel is fixed to the furling tube by forming around said furling tube a portion which cannot be unrolled. In addition, electrical connection means are arranged in the interior of the furling tube and pass through said furling tube on the portion of the flexible panel which cannot be unrolled, said electrical connection means being hooked up to the at least one photovoltaic panel at the proximal edge of the flexible panel.

20 Claims, 5 Drawing Sheets

AWNING TYPE SOLAR PROTECTION DEVICE EQUIPPED WITH AN ELECTRICAL POWER PRODUCTION SYSTEM

This is a Convention application claiming priority to French Patent Application No. 1057805 filed 28 Sep. 2010, the contents of which are incorporated herein by reference.

The present invention relates to a solar protection device of the awning type equipped with an electrical power production system. The electrical power produced can for example be stored in a battery type storage device or delivered to a device such as for example a fogger, a heating system, a lighting system or other device.

Solar protection devices of the awning type customarily include a furling tube which is for example activated by means of a mechanism of the crank type driving rotation of the furling tube in one direction or the other. Such a crank can be replaced by a motorized system.

The awning also includes a flexible panel capable of being rolled up onto the furling tube when the latter turns in one direction and, conversely, to be unrolled from said furling tube when it turns in the opposite direction. The awning also includes a tensioning system which applies tension to the distal end of the flexible panel. Thus, when the furling tube turns in the furling direction, the tension exerted on the end of the panel allows it to be furled while holding it under suitable tension, the tensioning system gradually retracting, which guarantees suitable folding or furling of the flexible panel around the furling tube. Conversely, when the flexible panel unrolls from the furling tube, the tensioning system deploys and allows deployment of the flexible panel by holding it under tension.

While the awning is in use, the flexible panel is deployed, allowing filtration of the solar rays. In the deployed position, the outer face of the flexible panel is exposed to the solar rays. The person skilled in the art has already contemplated the use of this awning design by integrating on the outer face of the flexible panel one or more photovoltaic panels which capture the sun's rays in order to produce electrical power, which may be stored by means of a battery or can directly supply an appropriate electrical device such as a fogger or a light source.

Such a design is for example described in publication EP.1.082.062 B1.

According to this design of an awning type solar protection device, the tensioning system includes a load bar arranged at the distal end of the flexible panel and one or more articulated arms mounted on springs or cylinders. This articulated arm tends to return to a normal deployed position under the influence of the spring, in the absence of a restraining force exerted by the portion of the flexible panel rolled up on the furling tube.

These articulated arms of the tensioning system have ducts or reservations allowing passage of electrical supply cables connected at one end to the terminals of the photovoltaic panels arranged at the distal end of the flexible panel, near the load bar, and on the other to a battery for storing energy or to an electrical device. These ducts or reservations have the disadvantage of increasing the cross-section of the articulated arms. In addition, the cables are arranged within these articulated arms, which bends the supply cables every time the awning is operated. The result is fatigue wear of these cables which may be damaged in the long run.

The invention aims to correct these drawbacks. To this end, the invention relates to a solar protection device of the awning type equipped with an electrical power production system. This device includes a flexible panel and at least one photovoltaic panel, also flexible and arranged on the outer face of the flexible panel. Likewise, the awning type solar protection system includes a furling tube onto which the flexible panel is rolled and from which it unrolls, depending on the direction in which the furling tube is driven. For this purpose the awning also includes a system for driving the furling tube in rotation which can be either mechanical or motorized, such drive systems being known to the person skilled in the art. It is understood that the at least one photovoltaic panel, attached to the outer face of the flexible panel, rolls up around the furling tube concomitantly with the flexible panel and unrolls from it, depending on its direction of rotation.

The awning type solar protection device also includes a tensioning system for the flexible panel during its deployment or its furling. Such a tensioning system will preferably consist of a load bar attached to the distal end of the flexible panel and of at least one articulated arm, as is known to the person skilled in the art. Of course, it is possible to contemplate variations of the tensioning system of the flexible panel without departing from the scope of the invention.

Remarkably, and according to the awning type solar protection device that is the object of the invention, the proximal edge of the flexible panel is fixed to the furling tube by forming around said tube a portion that cannot be unrolled from this tube. In addition, electrical hookup means are arranged inside the furling tube and run through said furling tube in the portion of the flexible panel that cannot be unrolled. In addition, the electrical hookup means are connected on the one hand to at least one photovoltaic panel, and the proximal edge of the flexible panel.

On the other hand, these electrical hookup means remain inside the furling tube for the purpose of supplying an electrical device. These electrical hookup means are therefore immobile with respect to the furling tube, with which they turn.

Thus, the design of the awning type solar protection device of the present invention, as described above, has the advantage of eliminating the outside run of the electrical connection cables between the photovoltaic panels and the battery type or other electrical device, passing through the articulated arms of the tensioning system, as is known from prior art. This therefore allows the cross-section of the articulated arms to be reduced. The design that is the object of the present invention, described above, also has the advantage that it can be employed with other tensioning systems such as for example tension cables mounted on spring-return reels and fixed to the distal end of the flexible panel so as to apply tension to it and thereby to tension the flexible panel.

The design of an awning type solar protection device, described above, has the additional advantage of avoiding any relative motion of the electrical hookup means and the furling tube when it is driven. The hookup of the electrical hookup means with at least one photovoltaic panel at the proximal end of the flexible panel that cannot be unrolled from the furling tube also avoids any force on the connections between the electrical hookup means and the at least one photovoltaic panel, which avoids any risk of breaking the electrical connection between said elements.

According to the object of the invention, the installation of a battery type or other device within the furling tube could be contemplated, in which case the electrical hookup means would be connected directly to this electrical device arranged within the furling tube. However, according to the invention, the solar protection device is preferably connected to an external electrical device. For that purpose, the awning type solar protection device that is the object of the present invention includes an electrical transfer system, comprising a movable part fixed to one end of the furling tube and turning with it, and a fixed part allowing electrical connection or hookup of an external electrical device, such as a battery for example, for the purpose of storing electrical energy, or a fogger, a lighting system, a heating system or other device. This electrical transfer system also includes sliding contact means configured to provide electrical continuity between the movable part and the fixed part and thereby to transfer electrical energy from the movable part to the fixed part.

Preferably, according to this design of the awning type solar protection device that is the object of the present invention, the movable part of the electrical transfer system includes two concentric conductive traces of different diameters and the fixed part of the electrical transfer system comprises at least two electrical contactors configured so as to be held respectively pressed against the two concentric conductive traces. Preferably, the fixed part comprises at least four electrical contactors in order to improve the stability of the rotating connection of the fixed part with the movable part.

An inversion can, however, be contemplated, that is the employment of concentric conductive traces on the fixed part and electrical contactors on the movable part, without departing from the scope of the invention.

According to this preferred design of the invention, the electrical contactors each comprise first electrical hookup means, which have the purpose of allowing a hookup to an external electrical device. Likewise, according to the invention, the concentric conductive traces each comprise second hookup means using electrical connections arranged inside the furling tube.

According to this preferred design, the at least one photovoltaic panel includes at its proximal edge a positive terminal and a negative terminal, said positive and negative terminals being connected respectively to the two concentric conductive traces through the electrical hookup means. Of course, in the case where the solar protection device includes more than one photovoltaic panel, each of them has a positive terminal and a negative terminal, the electrical hookup means allowing respectively the hookup of all the negative terminals to one of the concentric conductive traces and the hookup of all the positive terminals to the other of the two concentric conductive traces.

Preferably, the electrical hookup means consist of at least one set of two electrical wires connected at their first end respectively to the positive and negative terminals of said at least one photovoltaic panel and at their second end respectively to the two concentric conductive traces. The solar protection device will include as many sets of two electrical wires as photovoltaic panels.

Preferably, the first ends of these electrical wires are stripped and run through the furling tube and are respectively soldered to the terminals of the photovoltaic panel, at the proximal portion of the flexible panel that is cannot be unrolled from the furling tube.

According to a preferred design of the invention, the electrical contactors are mounted on springs so as to provide constant pressure on the concentric conductive traces.

According to the invention, a dovetail type connection is provided between the proximal end of the flexible panel and the furling tube. Other connections similar to a dovetail can of course also be contemplated without departing from the scope of the present invention. This connection is for the purpose of ensuring a permanent connection of the flexible panel to the furling tube in the event of a possible breakage of the means of assembling the panel to said furling tube, in the proximal portion that cannot be unrolled.

In one variation, the device according to the invention includes a motor for driving the furling tube and the movable part of the electrical transfer system includes a central opening configured so as to accommodate the proximal end of said motor.

The proximal end of the motor drives in rotation the movable part of the electrical transfer system as well as the furling tube and possibly the drum.

Said motor is delimited between the proximal and distal ends, at least one of its ends is connected to a first end of the furling tube and of the drum, preferably the second ends of the furling tube and of the drum are not connected with the distal end of said motor. In the latter case, the length of said motor is much less than the length of the furling tube and that of the drum.

Preferably, the movable part includes, on a first face oriented toward the furling tube, at least two radial grooves projecting from the periphery of its central opening so as to provide at least two spaces wherein the second electrical hookup means of the photovoltaic panel(s) can enter and are thus electrically hooked up respectively to the two concentric electrically conductive traces, which traces are supported on a second face of the movable part opposite to said first face.

In one variation, the fixed part of the electrical transfer system includes at least one exit opening for the electrical hookup means of the furling tube drive motor, and possibly a central hollow configured so as to accommodate the fixed proximal end of said motor.

In a sub-variation, said central hollow runs clear through and therefore has the form of a central opening.

Advantageously, the electrical hookup means of the drive motor leave the fixed part by the same end of the case accommodating the furling tube as the first electrical hookup means of the contactors, or possibly of the conductive traces, which allows a reduction of the length and therefore of the bulk of the electrical connection means of the photovoltaic panels, which can thus leave by the same end of the furling tube, and hence of the case, as the electrical hookup means of the drive motor. This arrangement thus makes it possible to limit the losses of electrical energy produced by the photovoltaic panels.

Possibly, said electrical hookup means and said electrical connection means can be combined into one and the same cable bundle.

The optimization of the length of the electrical connection means of the photovoltaic panel(s) makes it possible to limit the losses in transporting the electrical power produced by said photovoltaic panels.

In addition, the reduction of the bulk of the electrical connection means of the photovoltaic panel(s) allows the device according to the invention to be accommodated in locations of reduced size, such as for example in a motor home or a boat.

According to a preferred design, the furling tube is driven by means of a rotational drive motor. In addition, a control system of the motor is configured to stop the motor, and consequently the furling tube, if it is turning in a direction corresponding to the deployment of the flexible panel and in a position whereby a part of the proximal edge of the flexible panel remains permanently rolled around the furling tube.

In one variation, said portion of the flexible panel that cannot be unrolled extends over at least a quarter revolution of the furling tube, preferably over at least a full revolution of the furling tube so as to cover the proximal edge of the flexible panel fixed to the furling tube and said electrical connection means hooked up to said at least one photovoltaic panel at said proximal edge of the flexible panel.

If the portion that cannot be unrolled extends over at least one quarter, the bulk of the device according to the invention is reduced compared with a device wherein the portion that cannot be unrolled extends over more than a quarter revolution. It is then necessary to fix the portion that cannot be unrolled over a quarter revolution of the furling tube using attachment means, adhesive for example. This arrangement can be advantageous with respect particularly to the pursuit of a device having reduced bulk for equipping motor homes or boats in particular.

If the portion that cannot unroll extends over at least one revolution and covers the proximal edge attached to the furling tube, it is then unnecessary to fix via attachment means, particularly of the adhesive type, said portion that cannot unroll to the furling tube, since the flexible panel binds to itself around the furling tube, particularly in the case of tension applied by the tensioning system of said flexible panel system during its deployment. Advantageously, the portion that cannot unroll covers the electrical connection means running through the furling tube and electrically connected to the positive and negative terminals of the photovoltaic panel(s). This arrangement thus makes it possible to further improve the protection of said electrical connection means and facilitates the accommodation around the furling tube of a portion of the flexible panel which cannot be unrolled.

According to a variation in design, the proximal edge of the flexible panel is fixed to the furling tube in its portion that does not unroll, this attachment being achieved for example by adhesive bonding. It is of course possible to contemplate another means of attaching the proximal edge of the flexible panel to the furling tube in this portion that does not unroll.

Preferably, the portion that cannot be unrolled of the flexible panel extends over at least a quarter revolution of the furling tube.

Preferably, the flexible panel is covered with two to four photovoltaic panels depending on the dimensions of the awning type solar protection device.

The features and advantages of the invention will appear upon reading the following description of a preferred design which is supported by figures in which.

The awning type solar protection device 1 that is the object of the present invention includes, as is well known to the person skilled in the art, a flexible panel 2, a furling tube 3 and a tensioning system for the flexible panel. The flexible panel 2 has a width corresponding substantially to the length of the furling tube 3 on which said flexible panel can be rolled or unrolled depending on the direction of rotation of the furling tube 3. The tensioning system consists preferably of a load bar arranged at the distal end of the flexible panel and of one or more articulated arms equipped with spring or cylinder systems allowing the articulated arms in the deployed position to be returned to a normal position. Such a tensioning system is well known in awnings currently on the market. The flexible panel 2 has a length substantially equal to the corresponding length of the articulated arms in the deployed position. During rolling of the flexible panel 2 around the furling tube 3, the distal end fixed to the load bar exerts a force on the articulated arms which are folding, the portion of the flexible panel not rolled around the furling tube 3 remaining properly tensioned. Conversely, when the flexible panel 2 is unrolled from the furling tube 3, the articulated arms tend to return to the deployed position, which ensures the deployment of the flexible panel 2 by keeping it under proper tension.

The furling tube 3 is driven by means of a rotational drive system such as a crank or a motorized system, also known to the person skilled in the art.

The awning type solar protection device 1 that is the object of the present invention also includes at least one photovoltaic panel 4 which is arranged on the outer face of the flexible panel 2. For example, awning type solar protection device 1 includes between two and four photovoltaic panels depending on its dimensions. These photovoltaic panels 4 are flexible, which allows them to be rolled onto and unrolled from the furling tube 3 concomitantly with the flexible panel 2 on which said photovoltaic panels are fixed. Such a design of flexible photovoltaic panels is known to the person skilled in the art.

The attachment of the photovoltaic panels 4 to the outer face of the flexible panel 2 can be carried out by any means known to the person skilled in the art, for example by adhesive bonding, hot-melt gluing or welding to the flexible panel.

FIGS. 1 to 3A-3B illustrate an example of design of the furling tube 3 on the awning type solar protection device 1 that is the object of the present invention.

Figure 1:
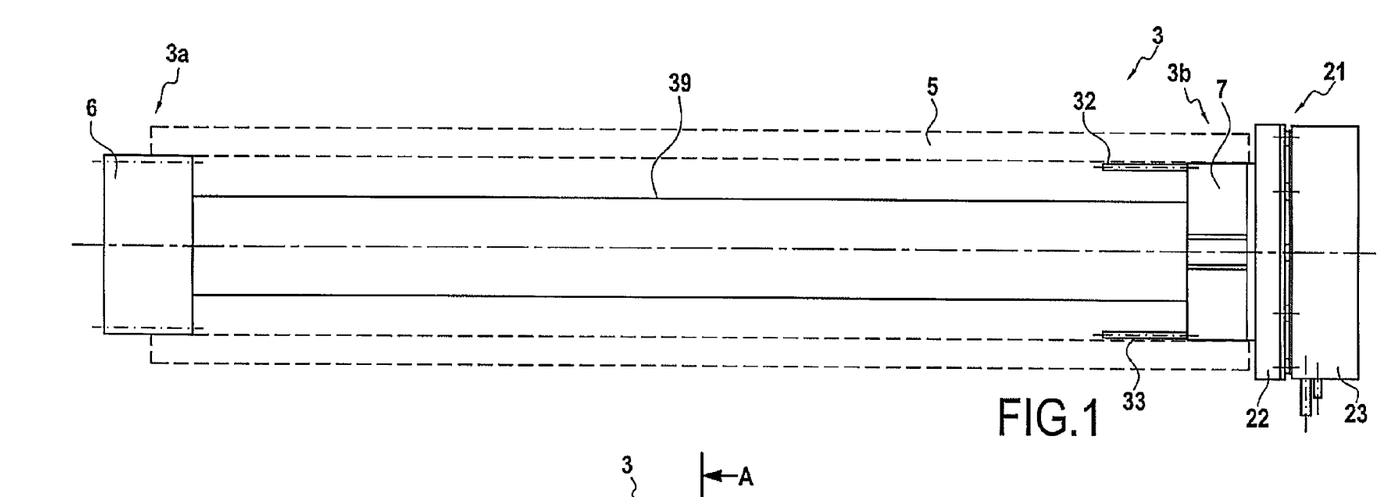
FIG. 1 illustrates a front view of a furling tube of the awning type solar protection device that is the object of the invention.
Figure 2:
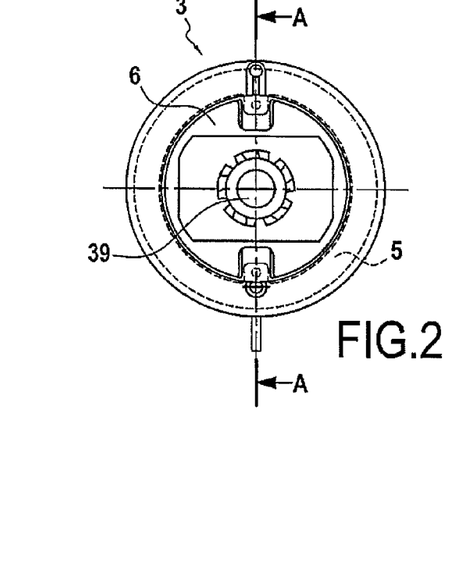
FIG. 2 is a side view of FIG. 1.
Figure 3A:
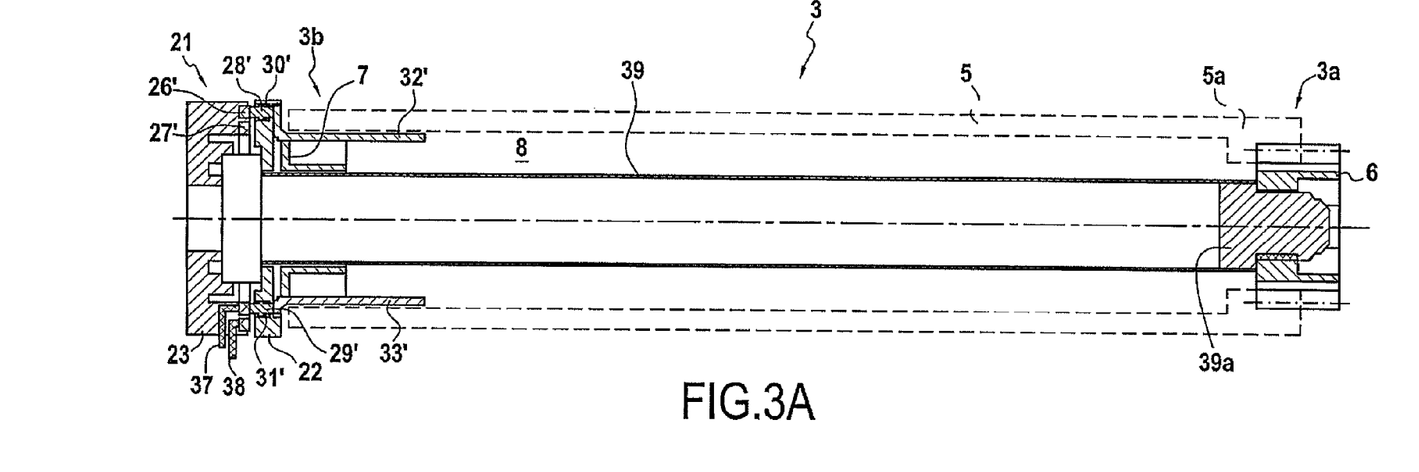
FIG. 3A is a section view in the A plane of FIG. 2, emphasizing an embodiment of the electrical transfer system.
Figure 3B:
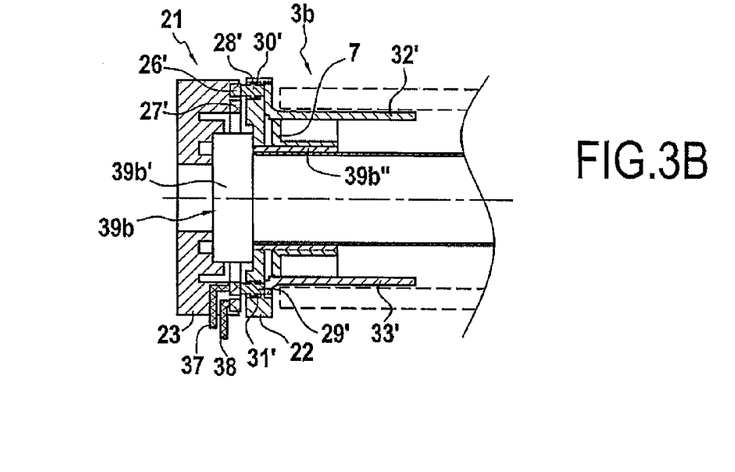
FIG. 3B is a section view in the A plane of FIG. 2 emphasizing the proximal end of the drive motor.

The furling tube 3 as illustrated in FIGS. 1 to 3A-3B, includes a motor 39 which extends over a part of the length of the interior of said furling tube 3, and a drum 5 illustrated in dotted lines in FIGS. 1 through 3, around which the flexible panel 2 is rolled. The motor 39 and the drum 5 are linked to one another in rotation at least one of the two ends 3a, 3b by means of connecting parts 6, 7 illustrated in FIGS. 3A and 3B. It is observed in FIG. 3A that the end 5a of the drum 5, the end 39a of the motor 39 and the connecting part 6 include fluting allowing said elements to mesh so as to link them in rotation. These connecting pieces 6, 7 also allow the motor 39 and the drum 5 to be kept coaxial. Thus, setting the motor 39 in rotation allows the drum 5 to be driven in rotation in the same direction.

The presence of a chamber 8, that is of an empty space wherein elements can be accommodated, between the motor 39 and the drum 5 is observed in FIG. 3A.

The awning type solar protection device 1, when it is equipped with such a motor 39 or with any equivalent motorized system allowing the furling tube 3 to be driven in rotation, includes a motor control system, not illustrated in the figures. This motor control system is configured to ensure stopping of the motor 39, and consequently of the furling tube 3, upon deployment of the flexible panel 2, in a position whereby a portion of the proximal edge 2a of the flexible panel 2 is kept permanently rolled around the drum 5 of the furling tube 3. Thus the proximal edge 2a of the flexible panel 2 cannot be unrolled from the drum 5 of the furling tube 3.

Figure 4:
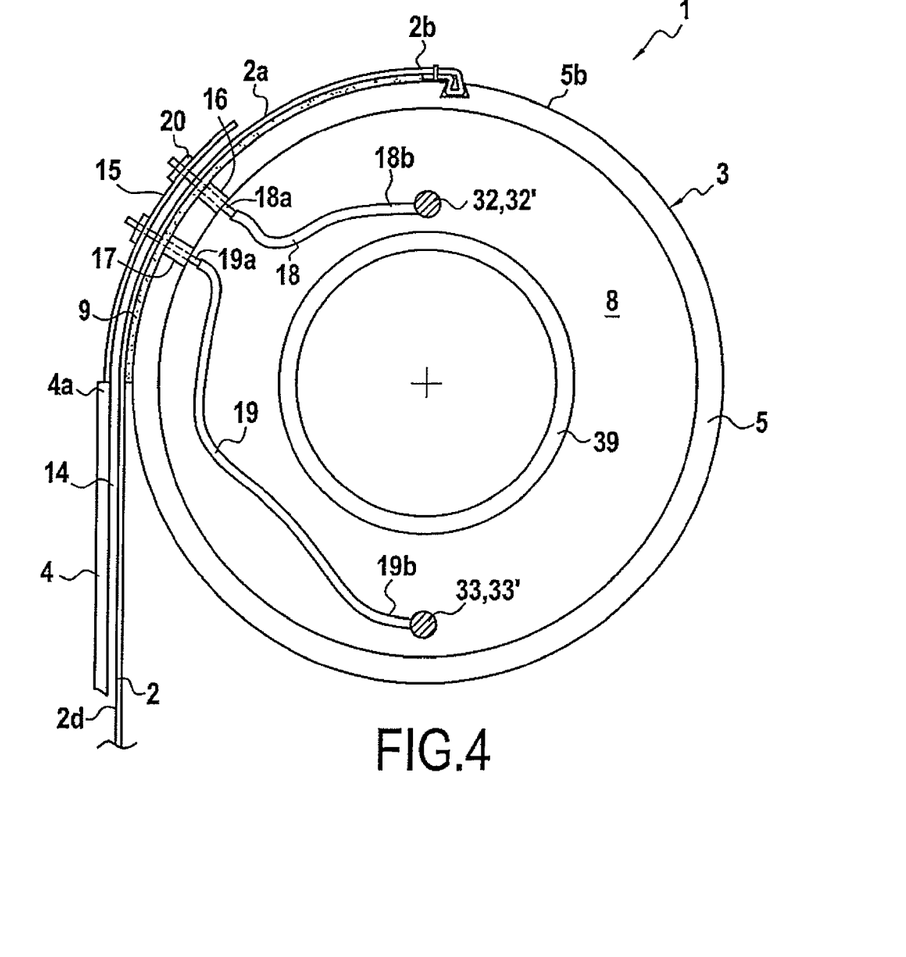
FIG. 4 illustrates the hookup of the photovoltaic panels to the furling tube of the awning type solar protection device that is the object of the present invention.

The proximal edge 2a of the flexible panel 2 can possibly be assembled to the outer face 5b of the drum 5 over a quarter revolution of said drum 5, as illustrated in FIG. 4, this assembly being for example accomplished by adhesive bonding 9. Thus the proximal edge 2a of the flexible panel 2 cannot be unrolled from the furling tube 3.

Figure 5:
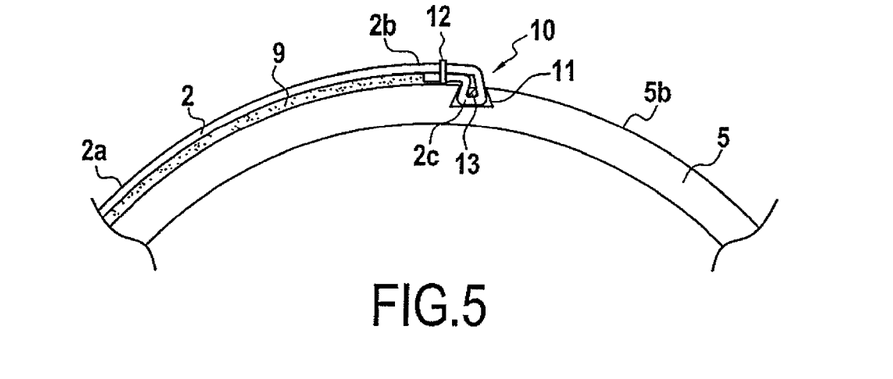
FIG. 5 is an enlargement of FIG. 4 emphasizing the assembly of the flexible panel to the furling tube.

The proximal end 2b of the flexible panel 2 is assembled to the drum 5 by means of a dovetail type connection 10 illustrated in greater detail in FIG. 5. To this end, the drum 5 includes a groove 11 in the shape of a dovetail extending longitudinally on said drum 5. In addition, the proximal end 2b of the panel 2 is folded over itself, the folded portion 2c being set in the dovetail-shaped groove 11. It is observed in FIG. 5 that the folded portion 2c also includes assembly by sewing 12 or by welding. In addition a bead type connection 13 extends longitudinally within the folded portion 2c, set in the dovetail groove 11. This design ensures that the proximal end 2b of the flexible panel 2 is kept assembled to the drum 5. The shape of the groove 11 can be different from that of a dovetail. Other means of assembly between the proximal end 2b of the flexible panel 2 and the drum 5 can also be contemplated.

In FIG. 4 is it observed that the photovoltaic panel 4 is assembled to the outer face 2d of the flexible panel 2. This assembly can for example be accomplished by adhesive bonding, hot-melt gluing or welding 14.

The presence of a terminal 15 is observed in FIG. 14, arranged at the proximal end 4a of the photovoltaic panel 4. This terminal 15 extends on the proximal edge 2a of the flexible panel 2, that is in the portion of the flexible panel that cannot be unrolled from the drum 5 of the furling tube 3. Of course, the photovoltaic panel 4 includes two terminals 15, to with a positive terminal and a negative terminal. In addition, when the awning type solar protection device 1 includes several photovoltaic panels 4, each of them has a positive terminal and a negative terminal.

It is observed in FIG. 4 that the drum 5 includes two apertures 16, 17 extending through the thickness of said drum 5 and allowing access to the chamber 8. The presence of two electrical wires 18, 19 is observed in this FIG. 4 having their first ends 18a, 19a stripped, these electrical wires 18, 19 preferably including an insulating protective sleeve. These stripped ends 18a, 19a of the electrical wires 18, 19 run through the apertures 16, 17 in the drum 5, as well as through the proximal edge 2a of the flexible panel 2 as can be observed in FIG. 4. It is observed in this FIG. 4 that the first end 18a of the first electrical wire 18 is assembled to the terminal 15 constituting for example the positive terminal. This assembly is preferably accomplished by soldering 20. Of course, the second stripped end 19a of the second electrical wire 19 is for its part assembled in a similar manner to the second terminal, which in this case is the negative terminal.

In the case where the awning type solar protection device 1 includes several photovoltaic panels 4, it will include an equal number of sets of two electrical wires 18, 19 hooked up respectively to each of the positive and negative terminals in a manner similar to that described previously.

The second ends 18b, 19b of the electrical wires 18, 19 are designed to be hooked up directly or indirectly to an electrical device. It would be possible, in fact, to contemplate accommodating this electrical device within the chamber 8. In this case, this electrical device would be configured to be accommodated within this chamber 8. Such a device could for example be batteries allowing storage of the electrical energy produced by the photovoltaic panels 4.

However, as illustrated in FIGS. 1 to 3A-3B, 6 and 7, the awning type solar protection device 1 that is the object of the invention preferably includes an energy transfer system 21.

This electrical transfer system 21 includes a movable part 22 and a fixed part 23. As illustrated in FIGS. 1 and 3A-3B, the movable part 22 is fixed to the end 3b of the furling tube 3 and turns with it.

As for the fixed part 23, it is designed to be fixed to a frame allowing in particular attachment to a support such as the wall of a building.

The assembly of the movable part 22 to the end 3b of the furling tube 3 can be accomplished by any means known to the person skilled in the art. For example, the presence of two radial grooves 24, 25 is observed in FIG. 7 which allow the accommodation of parts in the form of keys, attached to the end 3b of the furling tube 3.

Figure 6:
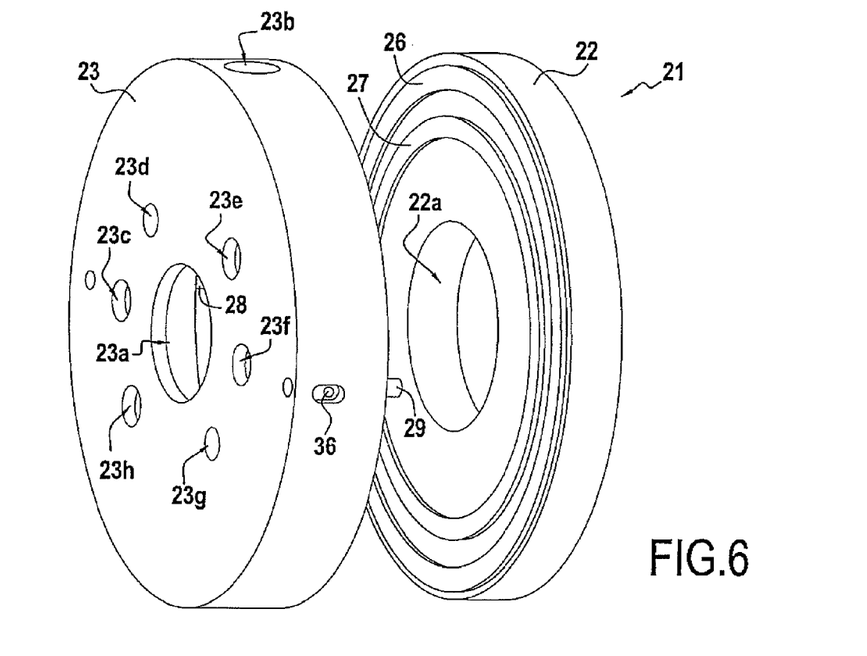
FIGS. 6 and 7 show in two perspective view a preferred design of the electrical transfer system on the awning type solar protection device that is the object of the invention, allowing the power to be delivered to an external electrical device.
Figure 7:
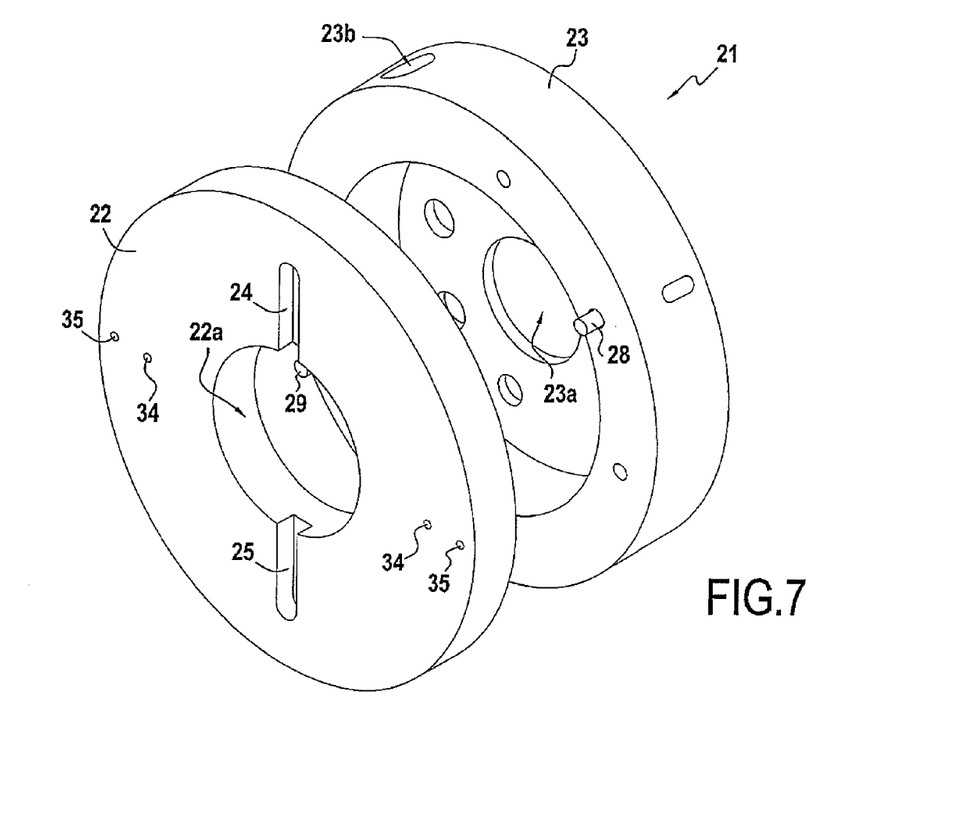

It is observed by way of FIGS. 6 and 7 that the movable part 22 includes two concentric conductive traces 26, 27. These two concentric conductive traces 26, 27 are remote from one another and have for that purpose different diameters so as to avoid any contact between them. In addition, the material used for the movable part 22 consists of an electrical insulator so that only the concentric conductive traces 26, 27 can conduct electricity.

Likewise in these FIGS. 6 and 7 it is observed that the fixed part 23 includes two electrical contactors 28, 29. When the fixed 23 and the movable 22 parts are pressed together as illustrated in FIG. 1, the electrical contactors 28, 29 respectively make contact with the two concentric conductive traces 26, 27, which provides electrical continuity between the fixed part 23 and the movable part 22 in relative motion. The fixed part 23 is also made of an electrically insulating material, only the electrical contactor 28, 29 conducting electricity.

In one variation, it is observed in FIGS. 6 and 7 that the movable part 22 includes a central opening 22a configured so as to accommodate the movable proximal end 39b" of said motor 39. In one variation, the movable part 22 includes radial grooves 24 and 25 projecting radially from its central opening 24 allowing a hookup for example with the brushes 32, 32', 33 and/or 33', which in their turn are electrically connected with the electrical connection means (for example the electrical wires 18 and 19) arranged within the furling tube 3. In this case, the grooves 24 and 25 are included in the second electrical hookup means of the photovoltaic panel(s). The pairs of apertures 34,35 can for their part allow the accommodation of parts in the form of keys, attached to the end 3b of the furling tube 3.

The movable proximal end 39b" is shown in FIG. 3B and drives the movable part 22 in rotation.

The fixed part 23 includes at least one exit opening for the electrical hookup means of the drive motor 39 for the furling tube 3. Said exit opening can be the central opening 23a shown in FIGS. 6 and 7, and/or a lateral opening 23b.

Preferably, the openings 23c through 23h arranged in the fixed part 23 are designed to accommodate mounting screws which make it possible to attach said fixed part 23 to the case not shown in the figures.

In this variation, the central opening 23a in the fixed part 23 is configured so as to accommodate the fixed proximal end 39b' of the motor 39; said fixed proximal end 39b' is shown in FIG. 3B.

Of course, variations in implementation of the electrical transfer system 21 can be contemplated. In this regard, a variation of design with respect to those illustrated in FIGS. 6 and 7 is observed in FIG. 3, whereby two concentric conductive traces 26', 27' are arranged on the fixed part 23 while two electrical contactors 28', 29' are arranged on the movable part 22. It is observed in this FIG. 3A that the electrical contactors 28', 29' are mounted on springs 30', 31' making it possible to guarantee that contact is maintained between the electrical contactors 28', 29' with the concentric conductive traces 26', 27' respectively. Such springs are also provided in the design illustrated in FIGS. 6 and 7.

The presence of two brushes 32, 33 is observed in FIG. 1, made of an electrically conductive material. These brushes 32, 33 are designed to penetrate inside apertures 34, 35 illustrated in FIG. 7. The positions correspond to the positions of the two concentric conductive traces 26, 27 respectively, said apertures 34, 35 communicating with said concentric conductive traces 26, 27. These brushes 32, 33 penetrate into the apertures 34, 35 and make contact with the concentric conductive traces 26, 27 so as to provide continuity of the electrical connection.

In the design illustrated in FIG. 3A, but also in FIG. 3B, the presence of brushes 32', 33' is also observed, the shape whereof is configured to allow contact to be made with the electrical contactors 28', 29'.

According to these two design variations of the electrical transfer system 21 illustrated in FIGS. 6 and 7 and in FIGS. 3A and 3B, it is observed that the brushes 32, 33, 32', 33' are set inside the chamber 8 within the furling tube 3. These brushes 32, 32', 33, 33' make it possible respectively to hook up the ends 18b, 19b of the two electrical wires 18, 19 as illustrated in FIG. 4. In the presence of several photovoltaic panels 4, each electrical wire hooked up at its end 18a to a terminal, the positive terminal for example, of one of the photovoltaic panels will be hooked up at its other end 18b to the first brush 32, 32'. Likewise, each electrical wire 19 hooked up at its end to the second terminal, the negative terminal in this case, of one of the photovoltaic panels 4, will for its part be hooked up at its other end 19b to the second brush 33, 33'. The connection of the ends 18b, 19b of the two electrical wires 18, 18a with the brushes 32, 32', 33, 33' can be accomplished by any means known to the person skilled in the art, by soldering for example.

It is also possible to provide for replacing the flexible electrical wires 18, 19 by other electrical connection means such as an extension of the brushes 32, 32', 33, 33', the extensions being hooked up to the terminals of the photovoltaic panels by running through the furling tube 3.

It is observed in FIG. 6 that the electrical contactor 29 includes hookup means 36, which are also provided on the second electrical contactor 28. These hookup means make it possible for example to hook up electrical cables which are then hooked up to an external electrical device such as a battery allowing storage of electrical energy for later delivery either to a heating device, a fogger, a lighting system or other device.

In the variation illustrated in FIG. 3A, the presence of second brushes 37, 38 is noted, constituting cable exits, these brushes 37, 28 being respectively in contact with the two concentric conductive traces 26', 27'.

Figure 8:
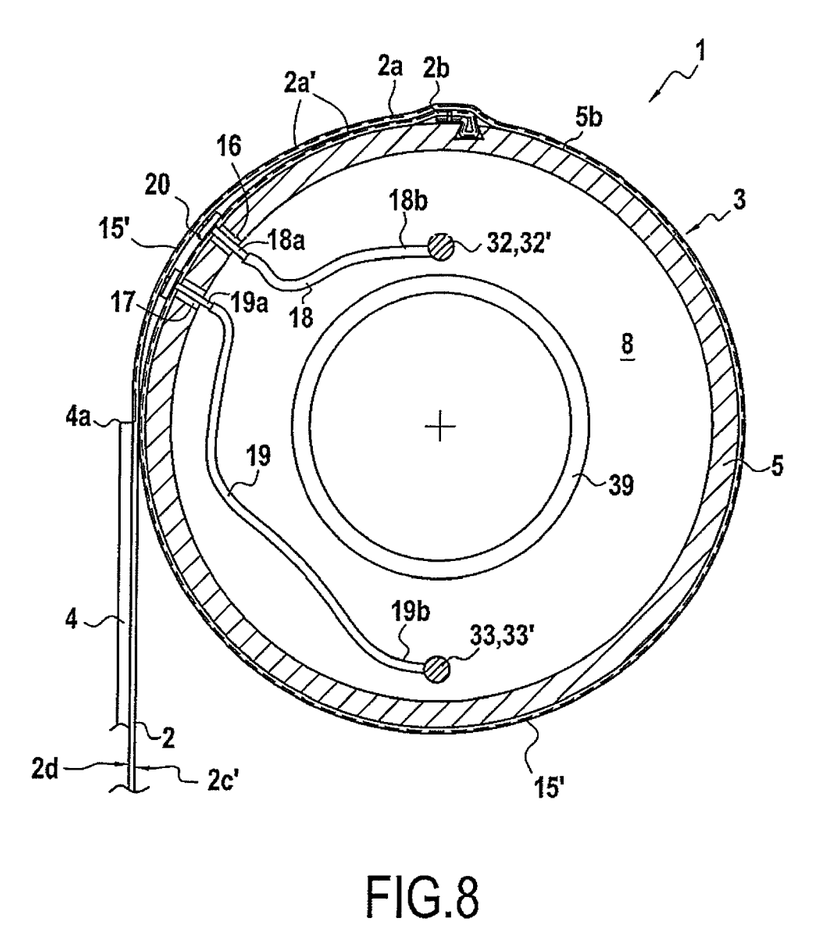
FIG. 8 shows a variation in the arrangement of the portion that cannot be unrolled of the photovoltaic panel around the furling tube illustrated in FIG. 4.

FIG. 8 shows a variation in implementation of FIG. 4 wherein the flexible panel 2 extends from its proximal edge 2a and over at least a full revolution of the furling tube 3 so as to cover the proximal edge 2b of the flexible panel fixed to the furling tube 3 and said proximal edge 2a and thus form a portion 2a' that cannot be unrolled. The references designating the same elements as in FIG. 4 are reused in FIG. 8.

Advantageously, in this variation, it is not necessary to fix by attachment means, particularly of the adhesive type, said portion 2a' that cannot be unrolled from the furling tube 3, because the portion 2a' of the flexible panel 2 that cannot be unrolled binds on itself around the furling tube 3 when tension is exerted on the distal edge 2c' of said panel 2, particularly in the case of tension exerted by the tensioning system of said flexible panel 2 during its deployment. Advantageously, the portion 2a' that cannot be unrolled covers the electrical connection means (20,18a,19a, 18,19) running through the furling tube 3 and in electrical connection with the positive and negative terminals 15 of the photovoltaic panel(s) 2. This arrangement also makes it possible to further improve the protection of said electrical connection means and facilitates the accommodation of a portion 2a' of the flexible panel 2 that cannot be unrolled around the furling tube 3. The positive and negative terminals extending from the photovoltaic panel 4 are embodied by the dotted lines referenced 15'. Said terminals 15' are preferably wires made of an electrically conductive material, preferably copper, and extending thus around the entire circumference of the furling tube 3. A protective electrically insulating film—not shown in the figures—preferably made of a polymer material allowing passage of solar radiation, covers the photovoltaic panel 4, the flexible panel 2 and the terminals 15'.

Other variations can be contemplated without departing from the scope of the present invention, particularly as regards means of hooking up to the concentric conductive traces 26, 27, 26', 27' and the electrical contactors 28, 29, 28', 29'. It is also possible to contemplate a different number of photovoltaic panels on the awning type solar protection device.

The invention claimed is:

1. An awning type solar protection device equipped with an electrical power production system, the device including a flexible panel, at least one photovoltaic panel arranged on the outer face of the flexible panel, a furling tube on which the flexible panel is rolled and a system for tensioning the flexible panel during its deployment or its furling, wherein the proximal edge of the flexible panel is fixed to the furling tube with an adhesive layer and is configured to form around said furling tube a rolled-up portion that cannot be unrolled when the flexible panel is in its fully deployed state, electrical connection device being arranged in the interior of the furling tube and passing through said furling tube in the portion of the flexible panel that cannot be unrolled, said electrical connection means being hooked up to the at least one photovoltaic panel at the proximal edge of the flexible panel wherein said device includes an electrical transfer system comprising a movable part fixed to one of the ends of the furling tube, a fixed part and sliding contact device configured for transferring electrical power from the movable part to the fixed part, the electrical connection device being hooked up to the movable part, and wherein said device includes a motor for driving the furling tube in rotation having a proximal end, and the movable part of the electrical transfer system includes a central opening to receive the proximal end of the motor therethrough.

2. The awning type solar protection device according to claim 1, wherein the movable part of the electrical transfer system includes two concentric conductive traces having different diameters and the fixed part of the electrical transfer system includes at least two electrical contactors configured to be held pressing respectively against the two concentric conductive traces.

3. The awning type solar protection device according to claim 2, wherein each of the electrical contactors includes first electrical hookup device.

4. The awning type solar protection device according to claim 2, wherein each of the concentric conductive traces includes second device for hooking up to the electrical connection device.

5. The awning type solar protection device according to claim 2, wherein the at least one photovoltaic panel includes at its proximal edge a positive terminal and a negative terminal, said positive and negative terminals being hooked up respectively to the two concentric conductive traces by way of the electrical connection device.

6. The awning type solar protection device according to claim 5, wherein the electrical connection device are made up of at least one set of two electrical wires hooked up at their first ends respectively to the positive and negative terminals of the at least one photovoltaic panel and at their second ends respectively to the two concentric conductive traces.

7. The awning type solar protection device according to claim 6, wherein the electrical wires, with their first ends stripped, are running through the furling tube and are soldered to the terminals of the photovoltaic panel.

8. The awning type solar protection device according to claim 2, wherein the contactors are mounted on springs so as to ensure constant pressure on the concentric conductive traces.

9. The awning type solar protection device according to claim 1, wherein a dovetail connection is provided between the proximal end of the flexible panel and the furling tube.

10. The awning type solar protection device according to claim 1, wherein the proximal edge of the flexible panel is fixed to the furling tube.

11. The awning type solar protection device according to claim 1, wherein the portion of the flexible panel that cannot be unrolled extends over at least a quarter revolution of the furling tube.

12. The awning type solar protection device according to claim 1, wherein the flexible panel is covered by two to four photovoltaic panels.

13. The awning type solar protection device according to claim 1, wherein the furling tube motor comprises an electrical hookup device and the fixed part of the electrical transfer system includes at least one exit opening for the electrical hookup device of the furling tube motor, and possibly a central hollow configured so as to accommodate the fixed proximal end of said motor.

14. The awning type solar protection device according to claim 1, wherein the portion that cannot be unrolled of the flexible panel extends over at least a quarter revolution of the furling tube, so as to cover the proximal edge of the flexible panel that is fixed to the furling tube and said electrical connection means hooked up to the at least one photovoltaic panel at said proximal edge.

15. The awning type solar protection device according to claim 1, including a motor control system configured to ensure the stopping of the motor upon deployment of the flexible panel in a position allowing a portion of the proximal edge of said flexible panel to remain constantly rolled around the furling tube.

16. The awning type solar protection device according to claim 1, wherein the portion that cannot be unrolled of the flexible panel extends over at least a full revolution of the furling tube so as to cover the proximal edge of the flexible panel that is fixed to the furling tube and said electrical connection means hooked up to the at least one photovoltaic panel at said proximal edge.

17. An awning type solar protection device equipped with an electrical power production system, the device including a flexible panel, at least one photovoltaic panel arranged on the outer face of the flexible panel, a furling tube on which the flexible panel is rolled and a system for tensioning the flexible panel during its deployment or its furling, wherein the proximal edge of the flexible panel is fixed to the furling tube and is configured to form around said furling tube a rolled-up portion that cannot be unrolled when the flexible panel is in its fully deployed state, electrical connection device being arranged in the interior of the furling tube and passing through said furling tube in the portion of the flexible panel that cannot be unrolled, said electrical connection means being hooked up to the at least one photo voltaic panel at the proximal edge of the flexible panel, said device comprises an electrical transfer system-comprising a movable part fixed to one end of the furling tube and turning with it and a fixed part allowing electrical connection or hookup of an external device said electrical transfer system also includes sliding contact devices to provide electrical continuity between the movable part and the fixed part and thereby to transfer electrical energy from the movable part to the fixed part,
    wherein said device includes an electrical transfer system comprising a movable part fixed to one of the ends of the furling tube, a fixed part and sliding contact device configured for transferring electrical power from the movable part to the fixed part, the electrical connection device being hooked up to the movable part, and
    wherein said device includes a motor for driving the furling tube in rotation having a proximal end, and the movable part of the electrical transfer system includes a central opening to receive the proximal end of the motor therethrough.

18. An awning type solar protection device equipped with an electrical power production system, the device including a flexible panel, at least one photovoltaic panel arranged on the outer face of the flexible panel, a furling tube on which the flexible panel is rolled and a system for tensioning the flexible panel during its deployment or its furling, wherein the proximal edge of the flexible panel is fixed to the furling tube and is configured to form around said furling tube a rolled-up portion that cannot be unrolled when the flexible panel is in its fully deployed state, electrical connection device being arranged in the interior of the furling tube and passing through said furling tube in the portion of the flexible panel that cannot be unrolled, said electrical connection means being hooked up to the at least one photovoltaic panel at the proximal edge of the flexible panel, said portion that cannot be unrolled of the flexible panel extends over at least a full revolution of the furling tube so as to cover the proximal edge of the flexible panel that is fixed to the furling tube and said electrical connection device hooked up to the at least one photovoltaic panel at said proximal edge,
    wherein said device includes an electrical transfer system comprising a movable part fixed to one of the ends of the furling tube, a fixed part and sliding contact device configured for transferring electrical power from the movable part to the fixed part, the electrical connection device being hooked up to the movable part, and
    wherein said device includes a motor for driving the furling tube in rotation having a proximal end, and the movable part of the electrical transfer system includes a central opening to receive the proximal end of the motor therethrough.

19. An awning type solar protection device equipped with an electrical power production system, the device including a flexible panel, at least one photovoltaic panel arranged on the outer face of the flexible panel, a furling tube on which the flexible panel is rolled and a system for tensioning the flexible panel during its deployment or its furling, wherein the proximal edge of the flexible panel is fixed to the furling tube and is configured to form around said furling tube a rolled-up portion that cannot be unrolled when the flexible panel is in its fully deployed state, electrical connection device being arranged in the interior of the furling tube and passing through said furling tube in the portion of the flexible panel that cannot be unrolled, said electrical connection means being hooked up to the at least one photo voltaic panel at the proximal edge of the flexible panel, said portion that cannot be unrolled of the flexible panel extends over at least a quarter revolution of the furling tube and is fixed to the furling tube using at least one attachment device, wherein said device includes an electrical transfer system comprising a movable part fixed to one of the ends of the furling tube, a fixed part and sliding contact device configured for transferring electrical power from the movable part to the fixed part, the electrical connection device being hooked up to the movable part, and wherein said device includes a motor for driving the furling tube in rotation having a proximal end, and the movable part of the electrical transfer system includes a central opening to receive the proximal end of the motor therethrough.

20. An awning type solar protection device according to claim 19 wherein the at least one attachment device is an adhesive.

\* \* \* \* \*